United States Patent
Slaughter

(10) Patent No.: US 10,794,968 B2
(45) Date of Patent: Oct. 6, 2020

(54) MAGNETIC FIELD SENSOR AND METHOD OF MANUFACTURE

(71) Applicant: Everspin Technologies, Inc., Chandler, AZ (US)

(72) Inventor: Jon Slaughter, Chandler, AZ (US)

(73) Assignee: Everspin Technologies, Inc., Chandler, AZ (US)

( * ) Notice: Subject to any disclaimer, the term of this patent is extended or adjusted under 35 U.S.C. 154(b) by 186 days.

(21) Appl. No.: 15/685,085

(22) Filed: Aug. 24, 2017

(65) Prior Publication Data

US 2019/0064288 A1 Feb. 28, 2019

(51) Int. Cl.
*G01R 33/09* (2006.01)
*H01L 27/22* (2006.01)
(Continued)

(52) U.S. Cl.
CPC ....... *G01R 33/098* (2013.01); *G01R 33/0035* (2013.01); *G01R 33/0052* (2013.01);
(Continued)

(58) Field of Classification Search
CPC .............. G01R 33/098; G01R 33/0035; G01R 33/0052; G01R 35/005; H01L 27/22; H01L 43/12
(Continued)

(56) References Cited

U.S. PATENT DOCUMENTS

| 6,946,834 | B2 * | 9/2005 | Van Zon | G01R 33/09 |
| | | | | 324/249 |
| 7,355,822 | B2 * | 4/2008 | Daughton | A45B 25/12 |
| | | | | 360/324 |

(Continued)

FOREIGN PATENT DOCUMENTS

| JP | 2012255796 A | 12/2012 |
| WO | WO 2018/008525 A1 | 1/2018 |

(Continued)

OTHER PUBLICATIONS

Nakano et al., Magnetic Tunnel Junctions With [Co/Pd]-Based Reference Layer and CoFeB Sensing Layer for Magnetic Sensor. IEEE Transactions on Magnetics, vol. 52, No. 7, Jul. 2016 (Year: 2016).*

(Continued)

*Primary Examiner* — Douglas X Rodriquez
*Assistant Examiner* — Sean Curtis
(74) *Attorney, Agent, or Firm* — Bookoff McAndrews, PLLC

(57) ABSTRACT

A magnetic field sensor that includes a differential bridge in which each path of the bridge includes a first type of magnetic field sensing device and a second type of magnetic field sensing device. The first and second types of magnetic field sensing devices differ in the magnetic moment imbalance present in the synthetic antiferromagnets (SAFs) included in their reference layers such that that different types of devices produce a different response to perpendicular magnetic fields, but the same response to in-plane magnetic fields. Such different magnetic moment imbalances in the SAFs of magnetic field sensing devices included in a bridge allow for accurate sensing of perpendicular magnetic fields in a differential manner that also cancels out interference from in-plane fields. Techniques for producing such magnetic field sensing devices on an integrated circuit are also presented. Moreover, the free layers within the magnetic field sensing devices can be adjusted in terms of their sensitivity range and level of sensitivity by manipulating the kink filed (Hk) for those free layers.

20 Claims, 10 Drawing Sheets

(51) Int. Cl.
*G01R 33/00* (2006.01)
*H01L 43/12* (2006.01)
*G01R 35/00* (2006.01)

(52) U.S. Cl.
CPC ............ *G01R 35/005* (2013.01); *H01L 27/22* (2013.01); *H01L 43/12* (2013.01)

(58) Field of Classification Search
USPC ................................................ 324/200–263
See application file for complete search history.

(56) References Cited

U.S. PATENT DOCUMENTS

| | | | | |
|---|---|---|---|---|
| 7,977,941 | B2* | 7/2011 | Mather | G01R 33/098 324/252 |
| 8,416,539 | B2* | 4/2013 | Carey | G11B 5/3909 360/324.11 |
| 8,427,246 | B2* | 4/2013 | Lee | H01L 43/08 331/94.1 |
| 8,508,221 | B2* | 8/2013 | Sun | H01L 43/12 324/249 |
| 8,525,514 | B2* | 9/2013 | Cai | G01R 33/18 324/252 |
| 8,647,891 | B2* | 2/2014 | Sun | H01L 43/10 438/3 |
| 8,685,756 | B2* | 4/2014 | Aggarwal | H01L 43/08 438/3 |
| 8,779,538 | B2* | 7/2014 | Chen | G01R 33/098 257/427 |
| 9,099,124 | B1* | 8/2015 | Freitag | G11B 5/3909 |
| 9,123,876 | B2* | 9/2015 | Deak | H01L 43/02 |
| 9,172,032 | B2* | 10/2015 | Shen | H01L 43/10 |
| 9,196,825 | B2* | 11/2015 | Huang | H01L 43/08 |
| 9,234,948 | B2* | 1/2016 | Deak | G01R 33/093 |
| 9,337,424 | B2* | 5/2016 | Yu | H01L 43/02 |
| 9,379,314 | B2* | 6/2016 | Park | G11C 11/161 |
| 9,537,087 | B2* | 1/2017 | Khalili Amiri | H01L 43/08 |
| 9,548,446 | B2* | 1/2017 | Park | G11C 11/161 |
| 9,575,143 | B2* | 2/2017 | Deak | G01R 33/098 |
| 9,614,145 | B2* | 4/2017 | Huang | H01L 43/10 |
| 9,614,147 | B2* | 4/2017 | Park | H01L 43/10 |
| 9,640,753 | B2* | 5/2017 | Sun | H01L 43/12 |
| 9,739,842 | B2* | 8/2017 | Holm | G01R 17/10 |
| 9,817,084 | B2* | 11/2017 | Deak | G01R 33/09 |
| 9,933,496 | B2* | 4/2018 | Holm | G01R 33/0206 |
| 10,050,192 | B2* | 8/2018 | Swerts | H01L 43/08 |
| 10,263,179 | B2* | 4/2019 | Isler | H01L 43/12 |
| 10,529,916 | B2* | 1/2020 | Huang | H01L 43/12 |
| 10,545,196 | B2* | 1/2020 | Holm | G01R 33/0011 |
| 2010/0033881 | A1* | 2/2010 | Carey | H01F 10/3286 360/324.11 |
| 2011/0169488 | A1* | 7/2011 | Mather | G01R 33/098 324/252 |
| 2011/0227569 | A1 | 9/2011 | Cai et al. | |
| 2013/0264666 | A1* | 10/2013 | Sun | G01R 33/098 257/421 |
| 2013/0300409 | A1* | 11/2013 | Deak | G01R 33/098 324/252 |
| 2013/0334634 | A1* | 12/2013 | Deak | G01R 33/098 257/427 |
| 2014/0035573 | A1* | 2/2014 | Deak | G01R 33/098 324/252 |
| 2014/0159179 | A1* | 6/2014 | Sun | G01R 33/098 257/427 |
| 2014/0361391 | A1* | 12/2014 | Shen | H01L 43/10 257/421 |
| 2015/0035095 | A1* | 2/2015 | Kim | H01L 43/08 257/421 |
| 2015/0091560 | A1* | 4/2015 | Deak | G01R 33/093 324/252 |
| 2015/0137292 | A1* | 5/2015 | Khalili Amiri | H01L 43/10 257/421 |
| 2016/0043306 | A1* | 2/2016 | Huang | H01L 43/12 257/427 |
| 2016/0097828 | A1* | 4/2016 | Deak | G01R 33/093 324/252 |
| 2016/0109535 | A1* | 4/2016 | Deak | G01R 33/09 324/252 |
| 2016/0225981 | A1* | 8/2016 | Deshpande | H01L 43/12 |
| 2017/0170390 | A1* | 6/2017 | Swerts | H01L 43/10 |
| 2017/0212176 | A1* | 7/2017 | Holm | G01R 17/10 |
| 2017/0215012 | A1* | 7/2017 | Deak | H04R 25/305 |
| 2017/0276738 | A1* | 9/2017 | Holm | G01R 33/0206 |
| 2017/0293001 | A1* | 10/2017 | Holm | G01R 33/093 |
| 2017/0307697 | A1* | 10/2017 | Holm | G01R 33/093 |
| 2018/0261269 | A1* | 9/2018 | Roiz Wilson | H01L 43/02 |
| 2018/0358066 | A1* | 12/2018 | Hu | H01L 43/12 |
| 2018/0358068 | A1* | 12/2018 | Hu | H01L 43/12 |
| 2019/0064288 | A1* | 2/2019 | Slaughter | G01R 33/098 |
| 2019/0172999 | A1* | 6/2019 | Chia | H01F 10/3272 |
| 2020/0083441 | A1* | 3/2020 | Huang | H01L 43/08 |

FOREIGN PATENT DOCUMENTS

| | | | |
|---|---|---|---|
| WO | WO 2018/079404 A1 | 5/2018 | |
| WO | WO-2019040408 A1 * | 2/2019 | ......... G01R 33/0035 |

OTHER PUBLICATIONS

Nakano et al., Magnetic tunnel junctions using perpendicularly magnetized synthetic antiferromagnetic reference layer for wide dynamic-range magnetic sensors. Appl. Phys. Lett. 110, 012401 (2017); (Year: 2017).*
Freitas et al., Spintronic Sensors. Proceedings of the IEEE | vol. 104, No. 10, Oct. 2016 (Year: 2016).*
Hiramatsu et al., Magnetic field angle dependence of out-of-plane precession in spin torque oscillators having an in-plane magnetized free layer and a perpendicularly magnetized reference layer. © 2016 The Japan Society of Applied Physics (Year: 2016).*
Written Opinion of the ISA—PCT/US2018/047185 (Year: 2020).*
International Preliminary Report on Patentability and Written Opinion issued in International Application No. PCT/US2018/047185, dated Dec. 20, 2018 (96 pages).
Nakano et al., "Magnetic tunnel junctions using perpendicularly magnetized synthetic antiferromagnetic reference layer for wide-dynamic-range magnetic sensors," Jan. 3, 2017, pp. 1-4, vol. 110, No. 1, AIP Publishing LLC (4 pages).
Nakano et al., "Magnetic Tunnel Junctions With [Co/Pd]-Based Reference Layer and CoFeb Sensing Layer for Magnetic Sensor," Jul. 1, 2016, pp. 1-4, vol. 52, No. 7, IEEE (4 pages).
Freitas et al., "Spintronic Sensors," Oct. 1, 2016, pp. 1894-1918, vol. 104, No. 10, IEEE (25 pages).

* cited by examiner

MAGNETIC FIELD SENSOR AND METHOD OF MANUFACTURE

TECHNICAL FIELD

The disclosure herein relates generally to magnetic field sensors, and, more particularly, to magnetic field sensors for sensing magnetic field perpendicular to the film plane.

BACKGROUND

Magnetic tunnel junctions (MTJs) include a free magnetic layer and a reference magnetic layer where the free and reference layers are separated by a dielectric layer to form a magnetic tunnel junction. The magnetic state of the reference layer is very stable such that it does not easily deviate from a steady state position, whereas the magnetic state of the free layer is more easily influenced by external magnetic fields. Deviations in the magnetization of the free layer result in changes in the resistance through the magnetic tunnel junction that can be sensed in order to, in the example of magnetic field sensors, detect and quantify externally applied magnetic fields.

Typical magnetic field sensors that include magnetic tunnel junctions have in-plane magnetized layers that are not sensitive to magnetic fields perpendicular to the film plane, where the film plane corresponds to the plane within which layers making up the devices in the sensors are formed or deposited. In order to sense such perpendicular fields that intersect the film plane at a 90 degree angle, some implementations rely on flux guides that manipulate the perpendicular field in order to re-orient the field with respect to the magnetic sensor and make the field detectable. Such flux guides add cost, and, if not implemented correctly, can result in sensing errors or limited accuracy.

It is desirable to provide magnetic field sensors capable of detecting perpendicular magnetic fields without the need for flux guides, where such sensors are easily manufactured and provide high performance.

DETAILED DESCRIPTION

Figure 1:
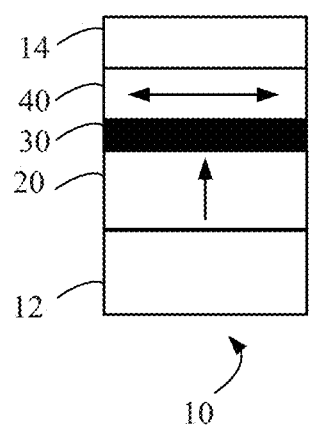
FIGS. 1-4 are block diagrams of magnetic field sensing devices in accordance with exemplary embodiments.

The following detailed description is merely illustrative in nature and is not intended to limit the embodiments of the subject matter or the application and uses of such embodiments. Any implementation described herein as exemplary is not necessarily to be construed as preferred or advantageous over other implementations.

For simplicity and clarity of illustration, the figures depict the general structure and/or manner of construction of the various embodiments. Descriptions and details of well-known features and techniques may be omitted to avoid unnecessarily obscuring other features. Elements in the figures are not necessarily drawn to scale: the dimensions of some features may be exaggerated relative to other elements to assist improve understanding of the example embodiments.

The terms "comprise," "include," "have" and any variations thereof are used synonymously to denote non-exclusive inclusion. The term "exemplary" is used in the sense of "example," rather than "ideal."

In the interest of conciseness, conventional techniques, structures, and principles known by those skilled in the art may not be described herein, including, for example, the physical composition of magnetic sensors, production of such sensors, fundamental principles of magnetism, basic operational principles of magnetic field sensors, and basic electronics.

During the course of this description, like numbers may be used to identify like elements according to the different figures that illustrate the various exemplary embodiments.

For the sake of brevity, the functional aspects of certain systems and subsystems (and the individual operating components thereof) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter.

Techniques and technologies may be described herein in terms of functional and/or logical block components, and with reference to symbolic representations of operations, processing tasks, and functions that may be performed by various computing components or devices. Such operations, tasks, and functions are sometimes referred to as being computer-executed, computerized, software-implemented, or computer-implemented. In practice, one or more processor devices can carry out the described operations, tasks, and functions by manipulating electrical signals that represent magnetic field strength and direction that are processed by control circuitry. It should be appreciated that the various clock, signal, logic, and functional components shown in the figures may be realized by any number of hardware, software, and/or firmware components configured to perform the specified functions. For example, an embodiment of a system or a component may employ various integrated circuit components, e.g., memory elements, digital signal processing elements, logic elements, look-up tables, or the like, which may carry out a variety of functions under the control of one or more microprocessors or other control devices.

Magnetic field sensors sense magnetic field in one or more directions. Such magnetic field sensors typically have an operating range within which they are operable to provide meaningful information regarding a magnetic field to which they are exposed. For example, if the magnetic field is so small that it is outside the operating range of the magnetic field sensor, the sensor may not generate accurate output information regarding such a field that is below its sensing threshold. Similarly, if the magnetic field is so great that it is above the operating range, the output information may not be accurate due to a non-linear response of the sensor or saturation of the magnetic field sensor response, and the magnetic field sensor may output information indicating that it is sensing a magnetic field having a magnitude that is equal to or greater than the high end of the dynamic range of the magnetic field sensor. When the magnetic field is within the dynamic range of the sensor, the magnetic field sensor generates accurate output information that is based on the magnetic field. For example, the magnetic field sensor may provide an analog output where the magnitude of the output is proportional to the magnitude of the magnetic field as detected by the sensor and the sign of the output indicates a positive or negative direction of the magnetic field with respect to the directional axis to which the magnetic field is referenced.

As noted above, typical magnetic tunnel junction magnetic field sensors have in-plane magnetized layers and have little sensitivity to fields perpendicular to the film plane. However, as described in more detail below, a magnetic tunnel junction sensing device that includes a reference layer magnetized perpendicular to the film plane and also includes a free layer having an easy axis aligned with the film plane can sense such magnetic fields perpendicular to the film plane.

Embodiments are also presented herein that overcome difficulties that may be associated with such magnetic tunnel junction sensing devices. For example, magnetic field sensing devices are often used together in a bridge structure to sense external magnetic fields. However, identical magnetic tunnel junction sensing devices that are wired in a bridge configuration will typically respond identically to an externally applied magnetic field, thereby producing no signal imbalance within the bridge. As discussed below, techniques are presented for producing magnetic tunnel junction sensing devices for use in such a bridge, where differences between the sensing devices result in a bridge that is fully differential such that externally applied magnetic fields are accurately sensed.

As also discussed in additional detail below, a typical in-plane free layer has demagnetization energy due to the thin-film geometry the produces a kink field (Hk), which, for a typically sized device may be on the order of 6-12 kOe. As a result, the response for a sensor using such an in-plane free layer is relatively insensitive to low magnitude external fields that are much less than the kink field of the free layer. Techniques are presented herein that allow the kink field for the free layer to be controlled such that the sensitivity of the free layer to lower-level magnetic fields is enhanced and/or the sensitivity of the free layer to fields within a certain range is optimized.

FIG. 1 illustrates a block diagram of a magnetic field sensing device 10. The magnetic field sensing device 10 includes a bottom electrode 12, a reference layer 20, a dielectric layer 30 corresponding to a tunnel barrier, a free layer 40, and a top electrode 14. The reference layer has a magnetization shown to be perpendicular to the film plane, where the film plane corresponds to the plane within which the different films corresponding to the magnetic field sensing device 10 are deposited. For example, the different layers corresponding to the magnetic field sensing device 10 are typically deposited or formed on a substrate such as a semiconductor wafer. Following deposition of those materials (e.g. films), etching is used to define each of the magnetic field sensing devices included on the underlying substrate. As also shown in FIG. 1, the free layer 40 of the magnetic field sensing device 10 has a magnetization that lies in-plane such that the direction of magnetization is aligned with the film plane.

The magnetic field sensing device 10 of FIG. 1 is constructed to sense magnetic field perpendicular to the film plane. For example, if the film plane corresponds to the plane within which the X-axis and Y-axis reside, the magnetic field sensing device 10 is constructed such that it will sense magnetic field applied in a direction corresponding to the Z-axis.

When magnetic field having a perpendicular (Z-axis) component is applied to the magnetic field sensing device 10 of FIG. 1, the magnetization of the free layer 40 is tilted either upward or downward, thereby either causing the free layer to be more aligned (more parallel) with the magnetization of the underlying reference layer 20, or less aligned (more anti-parallel) with the reference layer 20. Such a change in magnetic orientation of the free layer 40 changes the resistance through the magnetic field sensing device 10 in a manner that allows the magnetic field component applied along the Z-axis to be detected. The minimum resistance results when the magnetic field is strong enough that it forces the magnetization of the free layer 40 to be parallel to the magnetization of the reference layer 20. The maximum resistance corresponds to when the magnetic field causes magnetization of the free layer 40 to be anti-parallel with that of the reference layer 20.

When the resting, or steady-state, magnetic orientation of the free layer 40 is at a 90 degree angle to the resting magnetic orientation of the reference layer 20, the response of the magnetic tunnel junction in the magnetic field sensing device 10 is optimal in that the resistance curve corresponding to changes in the magnetic orientation of the free layer 40 has a maximum slope at that point and is also very linear. As such, the response to changes in the Z-axis field is also very linear such that the change in resistance tracks the field very closely and allows the magnitude of the Z-axis component of the applied field to be determined.

Notably, while FIG. 1 shows the magnetic orientation of the free layer 40 to lie along a particular line in the X-Y plane, which, for example could correspond to the X-axis, the particular in-plane orientation of the magnetization of the free layer 40 is irrelevant with respect to detecting field in the Z-axis direction. For example, the magnetization of the free layer 40 can extend into and out of the page and still provide the same sensitivity to Z-axis magnetic fields. While shape anisotropy can be used to provide an easy axis for the free layer that maintains the magnetic orientation of the free layer 40 in a particular direction within the X-Y plane, as discussed below, it may be preferable to utilize magnetic field sensing devices having a circular footprint in order to leave the orientation of the magnetization for the free layer 40 unrestricted within the X-Y plane.

The kink field (Hk) for a free layer of a magnetic field sensing device such as that shown in FIG. 1 corresponds to the point at which an externally applied magnetic field forces the free layer to be either parallel or anti-parallel to the reference layer. At that point, applying a higher magnitude magnetic field does not change the resistance through the magnetic memory cell as the maximum or minimum resistance has already been achieved by the free layer being parallel or anti-parallel to the reference layer. As also noted above, in some cases magnetic material deposited corresponding to the free layer will have a very high Hk based on the demagnetization energy generated from the thin-film geometry associated with the free layer. The Hk for a free layer is proportional to its magnetization, where a higher magnetization moves the kink field further away from a central axis corresponding to no external magnetic field being applied. While a higher Hk for the free layer allows for a wider range of sensing, this comes at the cost of lesser sensitivity within that wider range. Similarly, a lower Hk resulting from a free layer having lesser magnetization results in greater sensitivity within a smaller range, where the smaller range results from earlier saturation.

Figure 2:
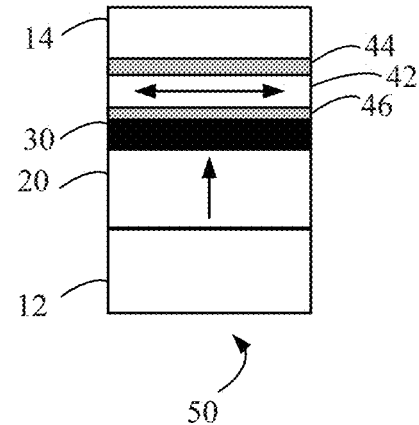

In order to adjust the Hk for the free layer, in some embodiments additional material can be placed at the top and bottom surfaces of the free layer in order to generate interfacial perpendicular magnetic anisotropy (PMA) that makes the free layer want to rotate, thereby reducing the kink field for that free layer. For example, as shown in FIG. 2, additional layers of material 44 and 46 can be placed above and below the free layer material 42 in order to generate interfacial PMA that will alter the Hk for the free layer. Note that in some embodiments, one or both of the layers 44 and 46 may not be present as interfacial PMA can be generated based on the interface of the free layer already existing neighboring layers, such as the dielectric layer 30 corresponding to the tunnel barrier. In some embodiments, additional dielectric material may be positioned above the free layer corresponding to an additional tunnel barrier or spacer layer that provides additional utility in the magnetoresistive stack in addition to generating PMA that modulates the Hk for the free layer. For example, magnesium oxide (MgO), at the borders of the material making up the free layer 42 can be used to modulate the Hk for the free layer such that a specific range of sensitivity and saturation can be established for that free layer. In other embodiments, other materials such as aluminum oxide, platinum, palladium, or combinations thereof can be used at the borders of the free layer to induce interfacial PMA.

In such embodiments, it may be desirable to establish a desired thickness for the free layer material, where, based on the magnetization of the free layer having that thickness and a known geometry, the interfacial PMA can be tuned in order to achieve a desired sensitivity range for the free layer. Thus, while plain material deposited to establish the free layer will have very high magnetization and not be terribly sensitive in a magnetic field sensing device, the Hk for that plain material can be tuned based on its thickness and PMA in order to achieve the sensitivity and range desired. Such techniques allow the Hk level for the free layer to be adjusted with reliable precision. The deposition of materials used in the magnetoresistive stack can be performed at a very slow rate that produces a reliable material thickness such that with accurate timing very precise Hk adjustments can be achieved.

In other embodiments, the inherent PMA of materials included within the free layer can be utilized to control the Hk for the free layer. For example, some materials have significant inherent PMA such that multilayer structures with internal PMA can be used within the free layer in order to establish the desired Hk for the free layer. Similarly, materials with crystalline anisotropy perpendicular to the film plane can also be used within the free layer to adjust the Hk. Thus, a typical free layer could include one or more layers of material such as cobalt iron boron (CoFeB), and can also include iron, MgO, $AlO_x$, Pt, or Pd within or bordering the free layer.

In addition to controlling the Hk, and hence the sensitivity range for the magnetic field sensing device, the bias voltage applied across the magnetic field sensing device can be controlled in order to vary the PMA of the free layer within the magnetoresistive stack. Changing the bias voltage applied can result in shifting the sensitivity range for the magnetic field sensing device. Such variation of the PMA within the free layer relies on voltage controlled magnetic anisotropy (VCMA) to provide additional control over the sensitivity range for the magnetic field sensing device. Thus, while many of the factors impacting the sensitivity range for the magnetic field sensing device are fixed during manufacturing operations, the bias voltage applied across the device during operation can also be used to impact the sensitivity range of the magnetic field sensing device. Calibration operations can be used to determine the impact of changing the bias voltage on the sensitivity range, and then register settings or other control mechanisms can be utilized to adjust the sensitivity range as needed.

Figure 9:
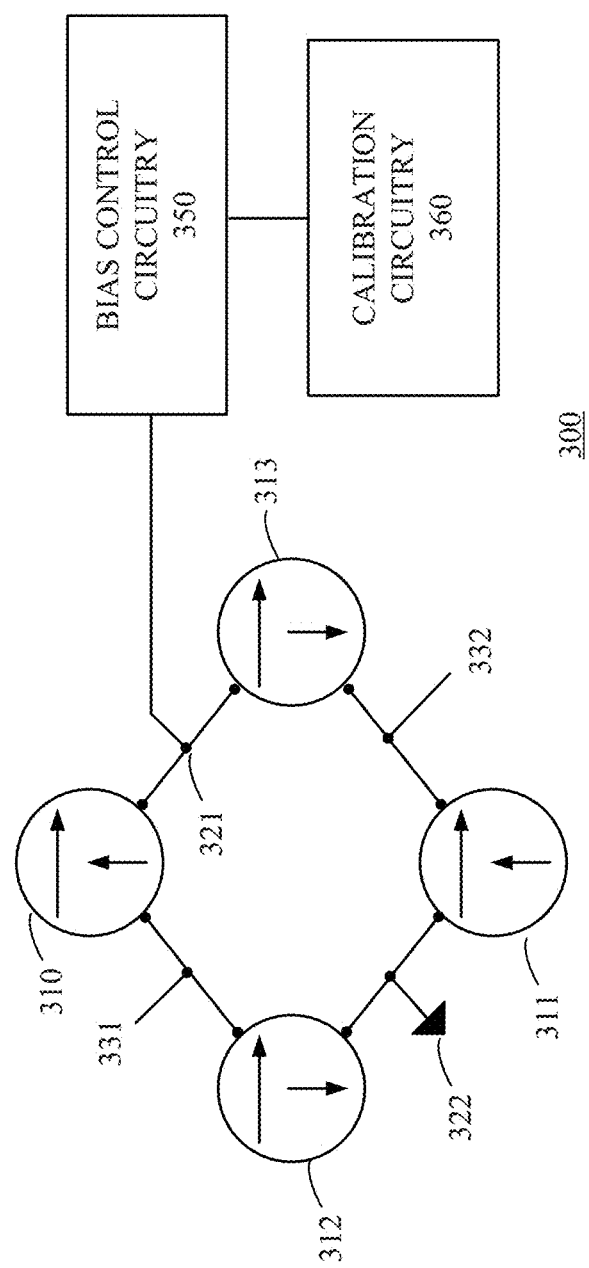
FIG. 9 is a block diagram of a magnetic field sensor in accordance with an exemplary embodiment.

Magnetic field sensors are typically formed using bridge structures that include a plurality of magnetic field sensing devices such as those shown in FIGS. 1 and 2. One example of such a bridge structure is shown in FIG. 9, which is discussed in additional detail below. In some instances, a bridge includes reference legs where dummy resistors or shielded sensors are used in the reference legs to provide a known reference resistance for a portion of the bridge. However, embodiments provided herein utilize four active sensor legs with opposite response on adjacent legs to form a differential bridge. Such a differential bridge simplifies the bridge layout and facilitates impedance matching over process variations as well as environmental factors such as temperature. In order to facilitate such fully differential bridge structures, the reference layers, within adjacent legs are set in opposite directions.

Figure 3:
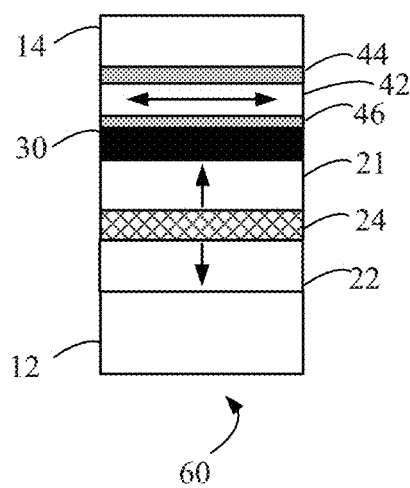
Figure 4:
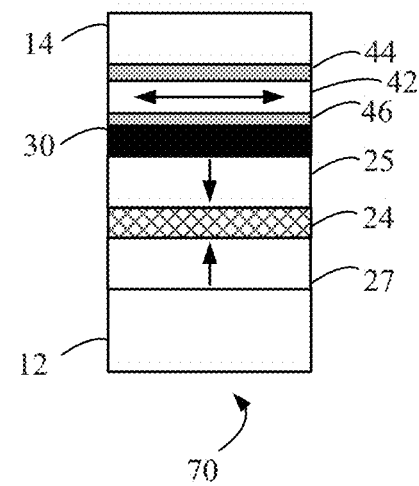

FIGS. 3 and 4 illustrate magnetic field sensing devices 60 and 70 having reference layers with their magnetization set in opposite directions. For example, the reference layer within the magnetic field sensing device 60 of FIG. 3 includes magnetic layer 21 having magnetization in the upward direction and magnetic layer 22 having magnetization in the downward direction, where a coupling layer 24 lies between the magnetic layers 21 and 22. The coupling layer 24 anti-ferromagnetically couples layers 21 and 22 such that, under normal conditions, the magnetization of layers 21 and 22 is opposite. In some embodiments, coupling layer 24 is ruthenium (Ru). Layers 21, 22, and 24 together form a synthetic anti-ferromagnet (SAF). In contrast, the reference layer (SAF) within the magnetic field sensing device 70 of FIG. 4 includes magnetic layer 25 having magnetization in the downward direction and magnetic layer 27 having magnetization in the upward direction, where the coupling layer 24 may be the same material and thickness as the coupling layer 24 of FIG. 3. Thus, the magnetic field sensing devices 60 and 70 illustrated in FIGS. 3 and 4 provide magnetic field sensing devices having opposite reference layer orientations that can be used in the bridge structure discussed below with respect to FIG. 9. As also discussed below, there are a number of different techniques that can be used to realize such magnetic field sensing devices having opposite reference layer magnetic orientations.

Figure 5:
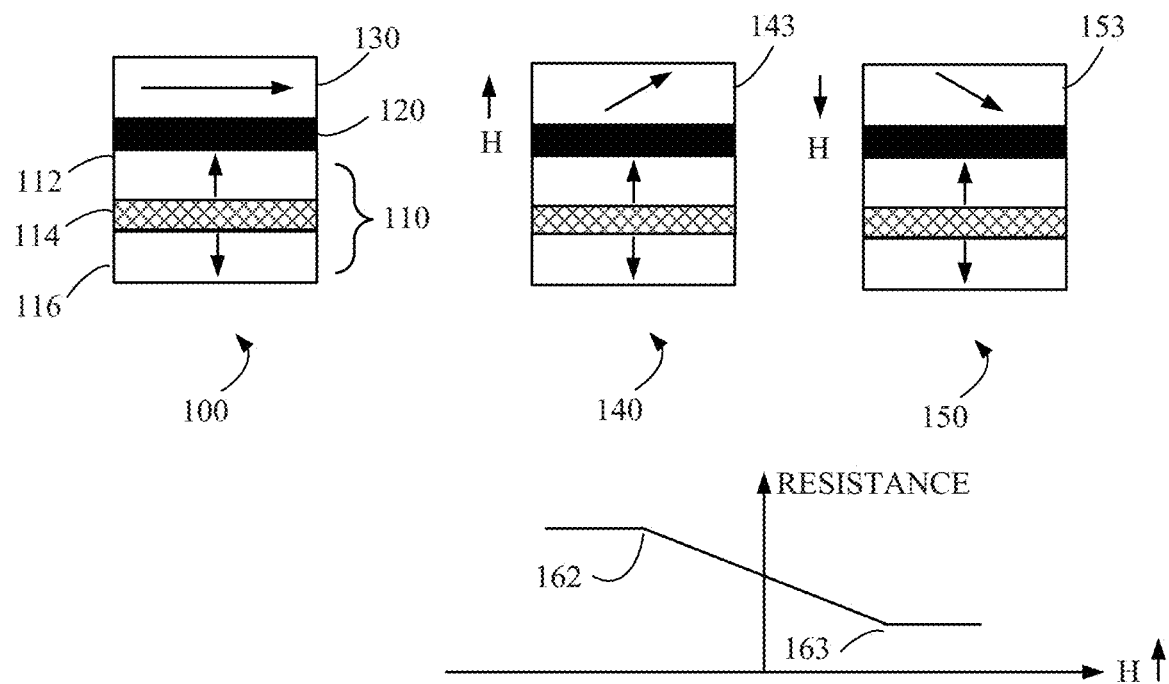
FIGS. 5-8 are block diagrams and graphs corresponding to magnetic field sensing devices exposed to different magnetic fields in accordance with exemplary embodiments.

FIG. 5 illustrates a portion of a magnetoresistive stack 100 corresponding to a magnetic field sensing device. FIG. 5 also illustrates how the different magnetic layers within that portion of the magnetoresistive stack 100 are influenced by magnetic fields applied perpendicular to the film plane. The portion of the stack 100 represents the magnetic state of the magnetoresistive stack in the steady state, or resting, condition where no magnetic field is being applied to the magnetic field sensing device. The portion of the magnetoresistive stack 100 includes free layer 130 having a steady state magnetization that is in-plane such that the magnetization corresponds to the film plane absent any applied external magnetic field. As discussed above, the free layer 130 can include multiple layers, and can be formed in order to have a desired Hk corresponding to a specific sensitivity range for sensing externally applied magnetic fields. A dielectric layer 120, which corresponds to a tunnel barrier, separates the free layer 130 from the reference layer 110. The reference layer 110 includes a first magnetic layer 112, a coupling layer 114, and a second magnetic layer 116.

As shown in FIG. 5, the reference layer 110 has a steady state magnetization in a first direction perpendicular to the film plane absent any applied external magnetic field. In this instance, because the orientation of the magnetic layer 112 that is closest to the dielectric layer 120 influences the resistance through the magnetic field sensing device based on its magnetization in comparison to that of the free layer 130, in the example illustrated the "first direction" is understood to be the upward direction.

FIG. 5 also illustrates the portion of the magnetoresistive stack 140 when an upward external magnetic field (shown as H with an upward arrow) is applied to the magnetic field sensing device. As is shown, the orientation of the magnetization of the free layer 143 is rotated upwards in response to the applied upward external magnetic field. As that upward field increases, the magnetization of the free layer 143 continues to rotate upwards until it is eventually aligned with the magnetization of the underlying upper magnetic layer within the reference layer. The graph below the partial stack structures illustrates how the resistance of the magnetic field sensing device decreases as the applied external upward magnetic field is increased. The decrease in resistance terminates at the kink field point 163 on the curve, which corresponds to when the magnetic orientation of the free layer points directly upward, thereby aligning it with the underlying reference layer and achieving the minimum resistance state through the magnetic tunnel junction. In fabricated devices the kinks in the R-H curve are rounded to some degree, depending on inhomogeneties in the magnetic materials and other aspects of the device that are not ideal. Similarly, a highly linear behavior in the operating range is desirable, but the linearity of fabricated devices will not be perfect.

Also illustrated in FIG. 5 is the portion of the magnetoresistive stack 150 when a downward external magnetic field (shown as H with a downward arrow) is applied to the magnetic field sensing device. As is shown, the magnetization of the free layer 153 is rotated downwards in response to the applied downward external magnetic field. As the downward field is increased, the magnetization of the free layer 153 continues to rotate downward. Eventually, the magnetization of the free layer 153 points directly downwards, and thereby the in the opposite direction of and directly anti-parallel to the magnetization of the underlying upper magnetic layer within the reference layer. The graph illustrates how the resistance of the magnetic field sensing device increases as the applied external downward magnetic field is increased, which corresponds to moving left of the center axis in the graph, until it reaches the kink field point 162 at which the maximum resistance is achieved. Note that the downward magnetic field corresponds to a negative upward magnetic field in the graph.

Figure 6:
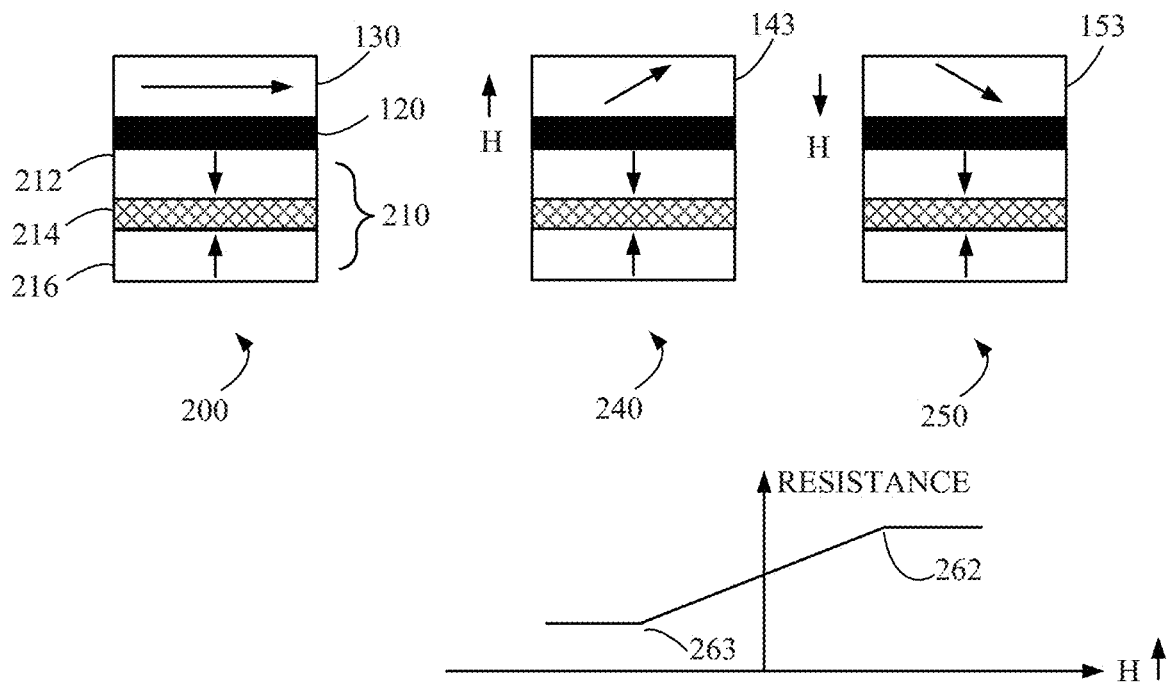

FIG. 6 shows a corresponding portion of a magnetoresistive stack 200 that includes a free layer 130, a dielectric layer 120, and a SAF as a reference layer 210 that includes magnetic layers 212 and 216 separated by coupling layer 214. As can be seen in FIG. 6, the magnetization of the SAF 210 is opposite to that of the SAF 110 shown in FIG. 5. The topmost magnetic layer within the SAF 210 (e.g. magnetic layer 212) has a magnetization in in the downward direction. In the embodiments of FIGS. 5 and 6, the downward direction of the magnetization of layer 212 corresponds to a second direction that is opposite the first, upward direction of the magnetization of layer 112 in the SAF 110 in FIG. 5.

FIG. 6 also shows the portion of the magnetic stack 200 under the influence of upward and downward and magnetic fields. As shown, in the portion of the magnetoresistive stack 240, the upward external magnetic field applied results in the magnetization of the free layer 143 being rotated in an upward direction, whereas in the portion of the magnetoresistive stack 250, the downward magnetic field results in rotation of the free layer 153 in the downward direction. The graph showing resistance versus externally applied magnetic field includes kink points 262 and 263. In the graphs, increasing upward magnetic field increases the resistance through the magnetic tunnel junction as such upward external magnetic field causes the magnetization of the free layer to become increasingly anti-parallel to the magnetization of the topmost magnetic layer in the SAF 210. Thus, the resistance response for the magnetic devices having SAFs with opposite magnetizations is also opposite. For a first SAF magnetization (shown in FIG. 6) the resistance increases in response to an increasing upward magnetic field, whereas for the other SAF magnetization (shown in FIG. 5), the resistance decreases in response to an increasing upward magnetic field.

Figure 7:
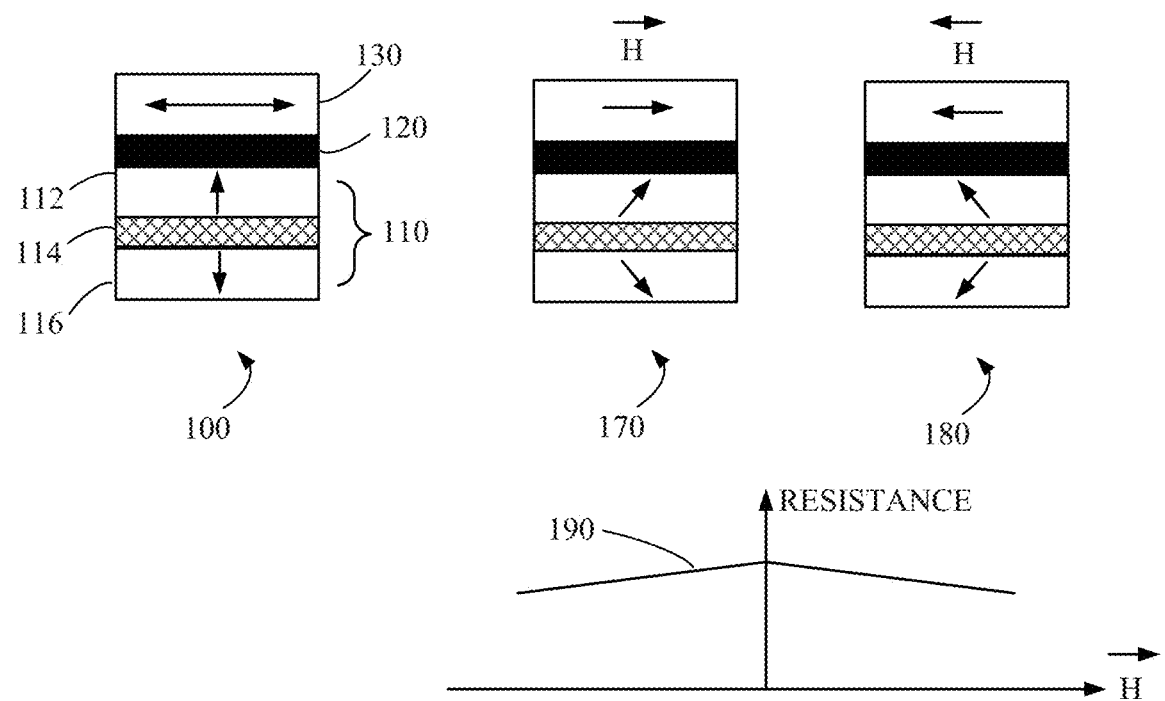
Figure 8:
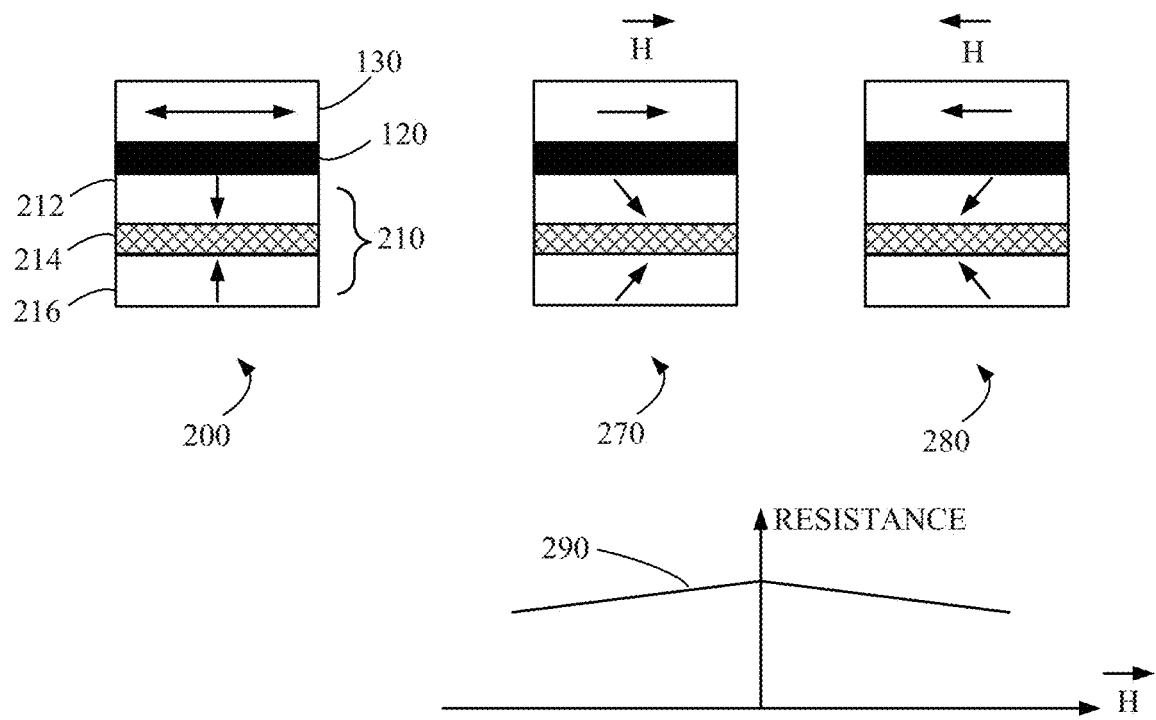

FIGS. 7 and 8 illustrate the resulting magnetization of the various layers included in the portions of the magnetoresistive stacks shown in FIGS. 5 and 6 in response to applied in-plane external magnetic fields instead of the perpendicular fields applied in FIGS. 5 and 6. As shown in FIG. 7, when a rightward external magnetic field is applied, the orientation of the free layer within the portion of the magnetoresistive stack 170 follows such that it points to the right, whereas a small amount of deviation (flexing) of the upward and downward orientations of the layers within the SAF 110 also results. It should be understood the change in magnetic orientation for the layers in the SAF structures shown in FIGS. 7 and 8 may be exaggerated in the illustration in order to aid in understanding the effects of such in-plane external magnetic fields. As a result of the flexing in the magnetization of the reference layer within the portion of the magnetoresistive stack 170, the resistance through the magnetoresistive stack decreases slightly as the applied magnetic field is increased. This is because the magnetic orientation of the top magnetic layer within the reference layer moves toward a parallel orientation with respect to the rightward magnetization of the free layer.

FIG. 7 also illustrates the impact of a leftward magnetic field with respect to the portion of the magnetoresistive stack 180. As shown, the leftward externally applied magnetic field results in a free layer magnetic orientation in the leftward direction, and a corresponding leftward flexing for the magnetic layers within the underlying SAF. As was the case with the application of a rightward magnetic field pointing, the resistance for a leftward magnetic field also decreases slightly as the top magnetic layer of the SAF is forced into a slightly more parallel magnetization with respect to that of the overlying free layer. Notably, the decrease in resistance corresponding to the magnetic field in either the right or the left direction is balanced as shown by the curve 190 in the graph included with FIG. 7.

If the device in which the portion of the magnetoresistive stack is included is patterned to be circular in shape, there is no in-plane shape anisotropy. As such, the magnetic moment of the free layer will follow an applied in-plane magnetic field such as the rightward and leftward fields applied in FIG. 7. The SAF in the device flexes in the direction of the applied field, but the response is weak because the SAF materials typically have strong PMA and strong coupling strength. As such, for fields of comparable strength, the resistance change through the device for in-plane applied magnetic fields is expected to be less than for applied perpendicular magnetic fields. If the free layer has in-plane uniaxial anisotropy due to shape or the properties of the magnetic material, the free layer moment may rotate more slowly with the applied in-plane field, but for devices made with the same shape and materials, the response of all devices will resemble the curve 190.

FIG. 8 illustrates the result of applied in-plane magnetic fields for a SAF 210 having an opposite orientation to the SAF 110 shown in FIG. 7. In FIG. 8, in the portion of the magnetoresistive stack 270, the rightward external magnetic field applied results in a small reduction in resistance as the magnetization of the SAF flexes in the same direction that the free layer is forced. The same is true for the portion of the magnetoresistive stack 280 which is subjected to a leftward external field. As can be seen from FIGS. 7 and 8, the change in resistance through the device for in-plane external magnetic fields is balanced regardless of the magnetic orientation of the SAF structure for the device. In other words, regardless of the direction of an applied in-plane magnetic field, the change in resistance through the magnetic tunnel junction is the same for a magnetic field of a certain magnitude. As discussed further below, this allows such devices to be used in a bridge structure, where such small changes resulting from in-plane external magnetic fields cancel out, thereby reducing or eliminating the impact of such in-plane magnetic fields on the detection of perpendicular magnetic fields.

FIG. 9 illustrates a block diagram of a magnetic field sensor 300 formed on a substrate, which, in some embodiments, corresponds to the substrate of an integrated circuit. The magnetic field sensor includes a plurality of magnetic field sensing devices 310-313. The plurality of magnetic field sensing devices 310-313 are inter-coupled to form a bridge. The bridge includes first path between a first bias node 321 and a second bias node 322, where, in the embodiment illustrated, the first path includes a first magnetic field sensing device 310 and a second magnetic field sensing device 312. The bridge also includes a second path between the first bias node 321 and the second bias node 322, where the second path includes a first magnetic field sensing device 311 and a second magnetic field sensing device 313.

For each of the magnetic field sensing devices 310-313 shown in FIG. 9, only the magnetization states of the free layer and the topmost magnetic layer within the reference layer are shown. However, in many embodiments, the structure of such magnetic field sensing devices corresponds to the structures discussed above with respect to FIGS. 1-8 in which the magnetic field sensing devices include a magnetoresistive stack having a free layer separated from a reference layer by a dielectric layer, and where the reference layer typically includes an unpinned SAF. As is shown, all of the magnetic field sensing devices 310-313 include free layers in which the steady-state magnetization of the free layer is in-plane with the film plane. All of the free layers preferably are same in composition and may include "tuned" structures in which the Hk for the free layers has been controlled to produce the desired response characteristics for the free layers with respect to externally applied magnetic fields.

Each of the first and second paths within the bridge includes both a magnetic field sensing device having a reference layer with a steady state magnetization in the upward direction as well as a magnetic field sensing device having a reference layer with a steady-state magnetization in the downward direction. For example, the first path includes magnetic field sensing device 310 having a SAF with the topmost magnetic layer magnetization oriented in the upward direction as well as the magnetic field sensing device 312 having a SAF with a magnetization corresponding to the downward direction. There are numerous techniques that can be employed to achieve magnetic field sensing devices on the same integrated circuit that have different steady-state magnetizations within their reference layers. For example, the different magnetic layers included in the synthetic antiferromagnet (SAF) structures can be formed using shared processing steps, but for some of the magnetic field sensing devices the magnetic moment of the topmost magnetic layer in the SAF is greater than the magnetic moment of the lower magnetic layer in the SAF, whereas for other magnetic field sensing devices, the opposite is true in that the lower magnetic layer in the SAF has a greater magnetic moment than the upper magnetic layer. This can be accomplished by different patterning and etching operations associated with formation of the devices, where specific example techniques are discussed in more detail below.

While the bridge illustrated and FIG. 9 only includes one magnetic field sensing device of each type (i.e. upward SAF and downward SAF) in each path between the bias nodes 321 and 322, in other embodiments, each path can include multiple magnetic field sensing devices of each type as long as the bridge remains balanced.

In the embodiment illustrated in FIG. 9, a first terminal of the magnetic field sensing device 310 is coupled to the first bias node 321, and a second terminal of the magnetic field sensing device 310 is coupled to the first terminal of the magnetic field sensing device 312 as well as node 331. The second terminal of the magnetic field sensing device 312 is in turn coupled to the second bias node 322. In the second path, the first terminal of the magnetic field sensing device 313 is coupled to the first bias node 321, and the second terminal of the magnetic field sensing device 313 is coupled to the first terminal of the magnetic field sensing device 311 as well as the node 332. The second terminal of the magnetic field sensing device 311 is coupled to the second bias node 322. In some embodiments, the circuitry is integrated into the same substrate as the sensors, whereas in other embodiments, the circuitry is external to the substrate of the sensor bridge.

In operation, the bias control circuitry 350 applies a bias voltage to the node 321. As shown in FIG. 9, the other bias node 322 is grounded. However, in other embodiments different bias voltages can be applied across the bridge, where both bias nodes may be driven to a non-zero voltages. As discussed above, the bias applied across the bridge can also be manipulated in order to utilize voltage controlled anisotropy to modify the sensing characteristics of the magnetic field sensing devices included in the bridge. Thus, the bias control circuitry 350 may include registers or other information storage to support the application of a selected bias voltage across the bridge depending on the application in which the bridge is being used. Calibration circuitry 360 coupled to the bias control circuitry 350 can be used to control the bias voltage applied across the bridge. Calibration circuitry 360 can also be used in generating an output signal corresponding to the bridge that indicates a magnitude and direction of a detected magnetic field. Calibration of magnetic field sensors is well understood in the art and the specific operations performed in order to calibrate the magnetic field sensor shown in FIG. 9 are not described in detail herein.

The bias voltage applied across the bridge between the bias nodes 321 and 322 is divided by the voltage dividers established in each path for the bridge. Because the bridge is balanced in that each path includes a first magnetic field sensing device having a reference layer in a first direction and a second magnetic field sensing device having a reference layer in a second direction, any resistance change in one path is also reflected in the other path. The opposite ordering of the different types of magnetic field sensing devices between the first bias node 321 and the second bias node 322 in each path allows for differential measurement of resistance changes in the bridge by measuring the voltage drop between midpoint nodes 331 and 332.

In the case of in-plane magnetic field applied to the bridge of the magnetic field sensor 300, the resulting change in resistance through magnetic field sensing devices 310-313 is essentially the same. As discussed above with respect to FIGS. 7 and 8, the resistance through each of the magnetic field sensing devices will be decreased by approximately the same amount regardless of the magnetic orientation of the SAF structure. As such, the bridge is balanced and the in-plane magnetic field induces no signal. In contrast, for perpendicular magnetic field, magnetic field sensing devices 310 and 311 respond the same in that their resistance is reduced for perpendicular magnetic field in the upward direction and their resistance is increased for perpendicular magnetic field in the downward direction. Magnetic field sensing devices 312 and 313 also respond alike, but in a manner that is opposite to that of magnetic field sensing devices 310 and 311. Thus, for perpendicular magnetic field in the downward direction, the resistance through magnetic field sensing devices 312 and 313 is reduced, whereas for perpendicular magnetic field in the upward direction, the resistance through magnetic field sensing devices 312 and 313 is increased.

Thus, if the magnetic field sensor 300 is exposed to a perpendicular magnetic field, the voltage dividers provide different midpoint voltages at nodes 331 and 332, where if the voltage at those nodes moves in opposite directions for a given perpendicular magnetic field. For example, for an upward directed perpendicular magnetic field, the resistance through the magnetic field sensing device 312 increases, whereas the resistance through the magnetic field sensing device 311 decreases. As such, the voltage between nodes 331 and 332 shifts in a differential fashion that reflects both the increased voltage drop across magnetic field sensing device 312 and the decreased voltage drop across magnetic field sensing device 311. For a perpendicular magnetic field in the downward direction, the opposite differential response occurs in that a lesser voltage drop appears across the magnetic field sensing device 312, whereas a greater voltage drop appears across magnetic field sensing device 311.

The output signal generated at the nodes 331 and 332 is a linear signal that is proportional to the perpendicular field component of any external magnetic field applied to the magnetic field sensor 300. As noted above, any in-plane field components of the magnetic field applied to the magnetic field sensor 300 are canceled out by the bridge structure and do not impact the output signal generated. As such, the magnetic field sensor 300 is able to provide accurate information regarding perpendicular magnetic fields in terms of both magnitude and direction.

In order to produce an integrated circuit that includes both types of magnetic field sensing devices represented by devices 310 and 312 in FIG. 9, the same process steps can be used for both devices, where the magnetic moments of the magnetic layers within the corresponding SAF structures are made to be different between the different types of devices. In some embodiments the different SAF structures are achieved based on different patterning of the SAFs with respect to etching operations. In one example embodiment, the thickness of the upper magnetic layers for all of the SAFs in both types of devices are the same and the thickness of the lower magnetic layers in the SAFs are also the same. However, but the first area associated with SAFs (e.g. the SAF footprint) of a first type of device is greater than that the second area for the SAFs in the second type of device. Thus, for some of the devices, the volume of material in the upper magnetic layer, which corresponds to the upper magnetic layer thickness multiplied by the first area, is greater than the volume of material in the lower magnetic layer, which corresponds to the lower magnetic layer thickness multiplied by the first area. In the second type of devices, the volume of material in the upper magnetic layer, which is the upper magnetic layer thickness multiplied by the second area, is less than the volume of material in the lower magnetic layer, which corresponds to the lower magnetic layer thickness multiplied by the second area.

The magnetic moment for each of the layers is calculated by multiplying the volume of the layer by the magnetization of the material. By creating an intentional magnetic moment imbalance within the unpinned SAF structures, the SAFs can be initialized to have different steady state magnetic orientations by exposing the entire integrated circuit to a very high perpendicular magnetic field that forces all of the magnetic layers to a specific known state. When the applied external magnetic field is removed, the magnetic layer in the SAF having the larger magnetic moment remains in the state induced by the applied external magnetic field, while the other magnetic layer within the SAF switches to the opposite state based on the anti-ferromagnetic coupling between the two magnetic layers in the SAF.

Figure 10:
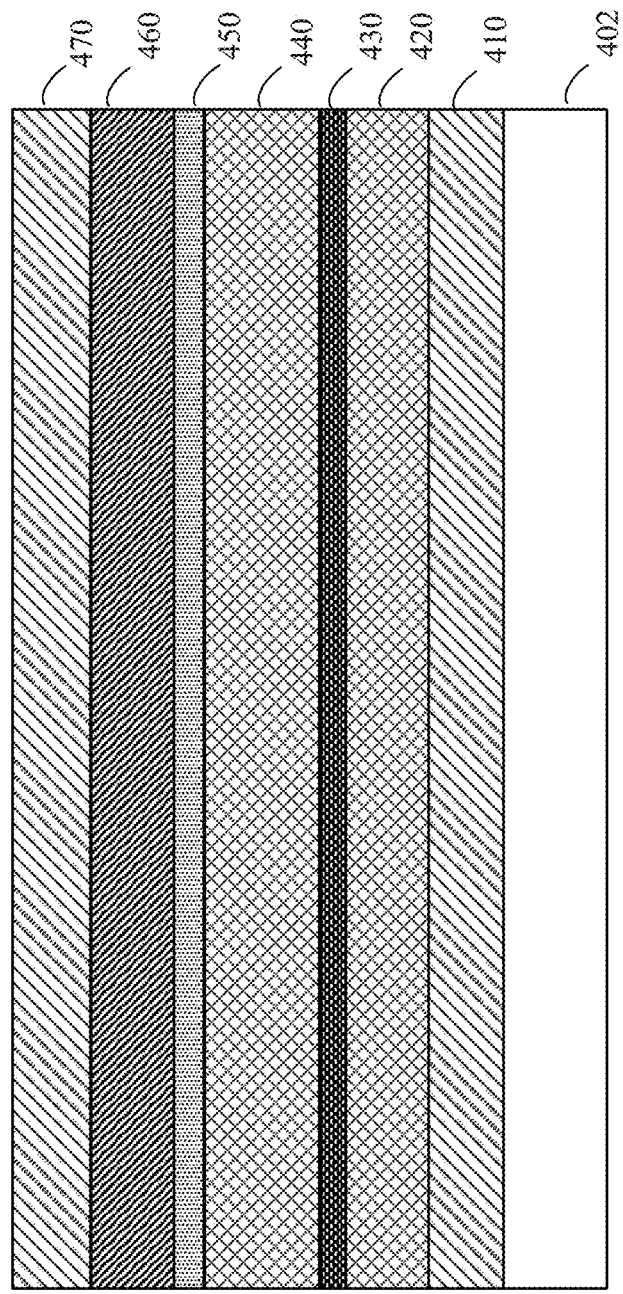
FIGS. 10-14 illustrate cross-sectional views of layers included in a magnetoresistive device during different stages of the manufacturing in accordance with exemplary embodiments.

FIGS. 10-14 illustrate cross-sectional views of various layers included in magnetic field sensing devices at different stages of manufacturing, where such magnetic field sensing devices can be produced in order to have different magnetic orientations in their SAF structures. FIG. 10 illustrates a plurality of layers formed on an underlying substrate 402. The plurality of layers includes a conductive layer 410 corresponding to a bottom electrode for each of the devices, a lower magnetic layer 420 corresponding to the lower magnetic layer within each of the SAFs, a coupling layer 430, an upper magnetic layer 440 corresponding to the upper magnetic layer within each of the SAFs, a dielectric layer 450, a free magnetic layer 460 corresponding to the free layer for each of the devices, and an additional conductive layer 470 corresponding to a top electrode for each of the devices. As discussed above, additional layers may be included in order to adjust the Hk for the free layer 460 in order to provide the desired level of range and sensitivity for the magnetic field sensing devices produced. Moreover, the specific layers shown in FIG. 10 are merely presented as an example, and additional layers are included in other embodiments.

Figure 11:
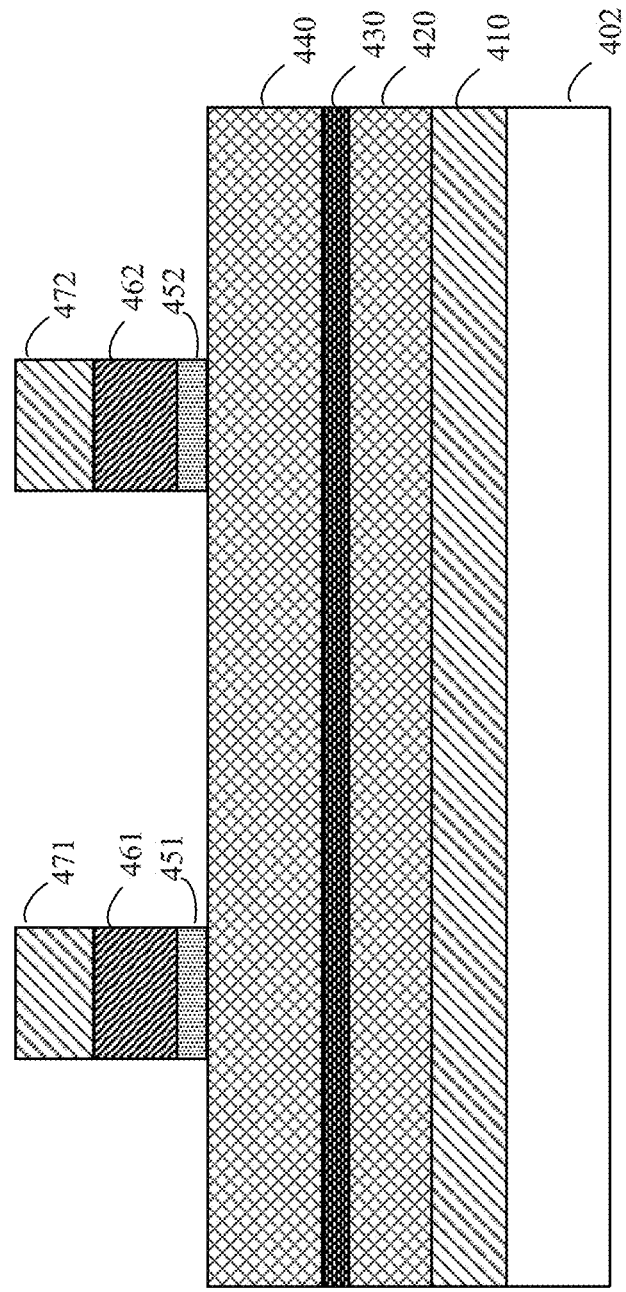

Turning to FIG. 11, a first etching operation is performed using a first pattern to produce the top electrodes 471 and 472, the free layers 461 and 462, and the dielectric layers 451 and 452 for each of a first and second magnetic field sensing device, respectively. Patterning for these portions of the two magnetic field sensing devices being formed in the context of FIG. 11 is preferably the same in terms of shape and area. Moreover, as noted above, in some embodiments, the shape of such patterning is circular such that in-plane magnetic fields have a uniform impact on the free layers 461 and 462 regardless of direction.

Figure 12:
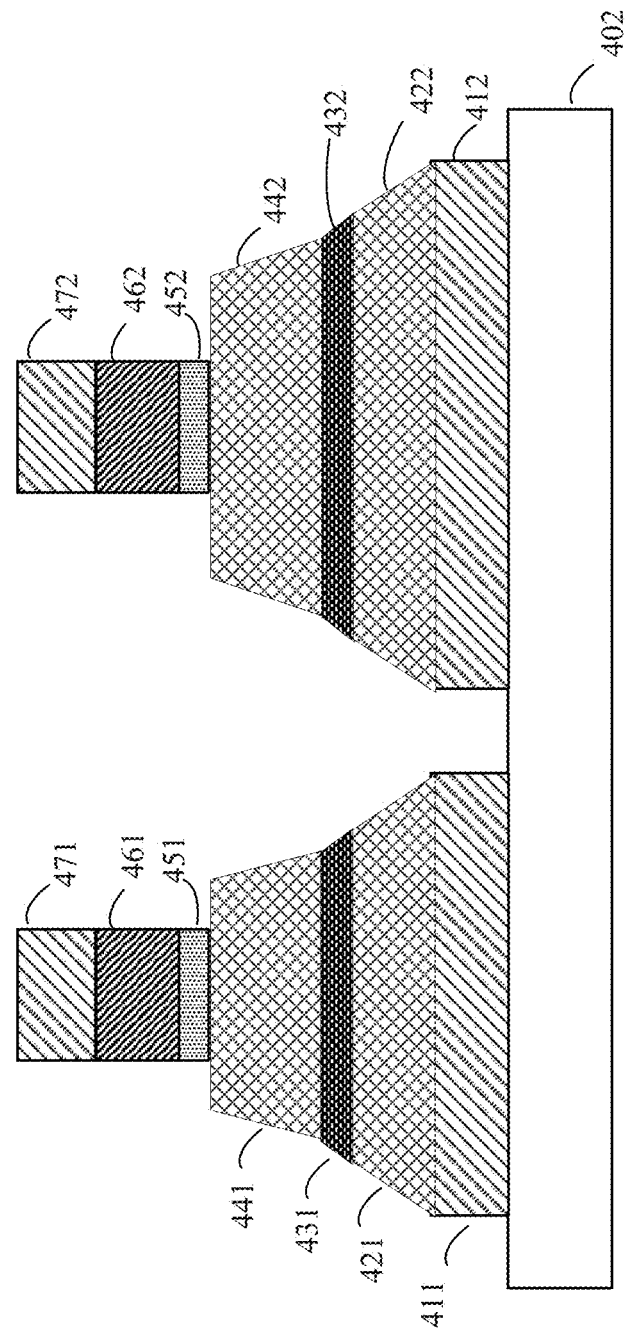

In FIG. 12 a second etching operation has been performed. The second etching operation uses different patterning (e.g. masking) for the different types of magnetic field sensing devices. More specifically, the upper magnetic layer 441 is of the magnetic field sensing device on the left is patterned to have a smaller area than the upper magnetic layer 442 of the magnetic field sensing device on the right. As is shown, the second etching operation results in a sloped sidewall for the SAF structures in the magnetic field sensing devices. The sloped sidewalls are typical in etching operations, and can be controlled to be more or less pronounced (i.e. more or less slope) based on the materials included in the layers being etched as well as the etchants used to etch those layers. For example, cobalt/nickel (Co/Ni) multilayers, which can be used for one or both of the magnetic layers in the SAF structures, are etched away faster than cobalt/platinum (Co/Pt) multilayers. As another example, isotropic etching generally results in sloped sidewalls as the etchants impact the material being etched from all directions, and, as such, the top portion of the layer experiences more etching time and a greater reduction in area.

As shown in FIG. 12, the thickness of the upper layer of magnetic material within the SAF that is etched to form layers 441 and 442 is greater than the lower layer of magnetic material etched to form layers 421 and 422. As such, if the area of the etched upper layer is the same as the area of the etched lower layer, the volume of the upper layer is greater and therefore the upper layer will have a greater magnetic moment. However, because of the sloped sidewalls and differing amounts of area reduction between the upper layer of magnetic material and the lower layer of magnetic material within each of the devices, the magnetic moments of the magnetic layers in the SAFs of the two depicted devices can be configured to be different. In the right device, the magnetic moment of the upper layer of magnetic material 442 is greater than the magnetic moment of the lower layer of magnetic material 422 because the additional area in the lower layer of magnetic material 422 does not overcome the greater thickness of the upper layer of magnetic material 442. In contrast, the relative difference in areas of the lower layer of magnetic material 421 and the upper layer of magnetic material 441 in the device on the left creates a relative volume difference between the two such that the lower layer 421 has a greater magnetic moment than the upper layer of magnetic material 442 even though the upper layer of magnetic material 442 has a greater thickness. It is understood by those skilled in the art that the initial imbalance between the upper and lower layers described for FIG. 10, which makes a SAF either "top heavy" or "bottom heavy," can be accomplished by means other than layer thickness. For example, the lower layer could be fabricated from different ferromagnetic alloys or multilayered stacks than the lower layer, producing a different areal moment (moment per film area covered) or a different perpendicular magnetic anisotropy strength that makes the layers respond differently to an applied magnetic field used to set the magnetic states of the devices in the production process.

Based on a predetermined thickness differential between the upper magnetic layer within each SAF and the lower magnetic layer within each SAF, a needed area differential can be determined in order to have some SAFs be "top-heavy" in that the magnetic moment of the upper magnetic layer is greater than the magnetic moment of the lower magnetic layer, while some SAFs are "bottom-heavy" in that the magnetic moment of the lower magnetic layer is greater than the magnetic moment of the upper magnetic layer. In some embodiments, it is desirable to minimize the area differential in order to ensure balanced operation of the magnetic field sensing devices within the bridge with respect to in-plane magnetic fields that may be applied.

Therefore, the same process steps can be used to generate two different types of magnetic field sensing devices where the different types have different magnetic orientations for their corresponding SAF structures. The only difference between the two types of devices is the patterning used to form the layers below the dielectric layer that functions as a tunnel barrier within the magnetic field sensing devices. Thus, only the SAFs and the bottom electrodes are patterned differently, whereas the other layers within the devices are the same.

Notably, the embodiment discussed with respect to FIGS. 10-12 includes differentiating the magnetic moments within the SAF structures based on an increased area for some of the SAF structures. While not shown in the drawings, in other embodiments, differing thicknesses for the materials making up the SAF structures for the devices can be used to establish different magnetic orientations in the SAF structures for the different types of magnetic field sensing devices. Although also not shown in the figures, in some embodiments multiple devices can be formed by including multiple free layers and dielectric layers constituting partial stack structures overlying a shared set of layers corresponding to a SAF where the SAF structure is shared amongst multiple devices.

As noted above, the etch process corresponding to FIG. 12 can be controlled in order to increase or decrease the slope of the sidewalls for the layers included in the SAF structure. For example an isotropic etch may result in greater slope. Moreover, the material for the different magnetic layers within the SAF structure can be selected to respond differently to the etching operation. For example the upper layer of magnetic material may be more susceptible to the etchants used during the etching of the SAF then the materials included in the lower layer of magnetic material for the SAF such that a larger area differential between the upper and lower layers can be achieved.

In other embodiments the etching through the layers corresponding to the SAF structures can be separated into multiple etching steps, where a first etch goes through the upper layer of magnetic material but stops on the layer of coupling material separating the upper layer of magnetic material from the lower layer of magnetic material. In some embodiments, the coupling material is ruthenium (Ru) or iridium (Ir), which can act as an etch stop for this first etching operation. The first etch can remove material and the upper layer of magnetic material such that the area is significantly reduced, while a second etching operation etches through the lower layer of magnetic material results in less of an area reduction with respect to that layer.

Figure 13:
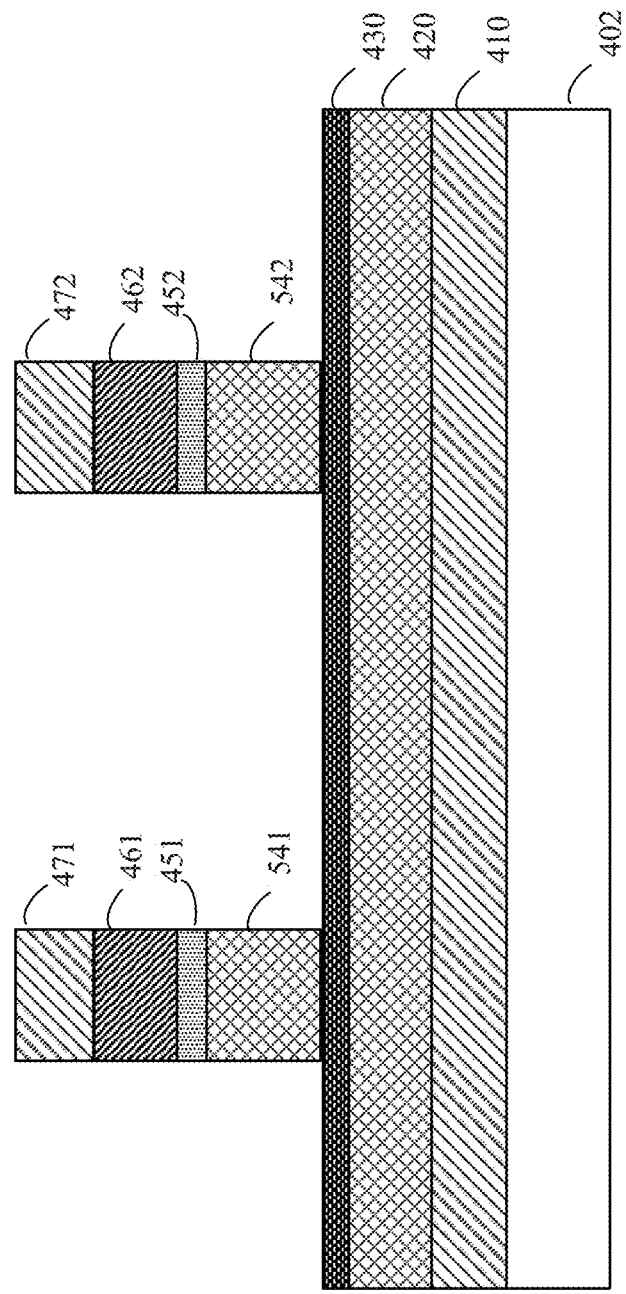

FIG. 13 illustrates a first etching step corresponding to a different embodiment in which the upper portion of the magnetic field sensing devices is still the same, but further includes the upper layer of magnetic material in the SAF structure. Thus, the layers 541, 451, 461, and 471 corresponding to the device on the left have the same dimensions as the layers 542, 452, 462, and 472 for the device on the right.

Figure 14:
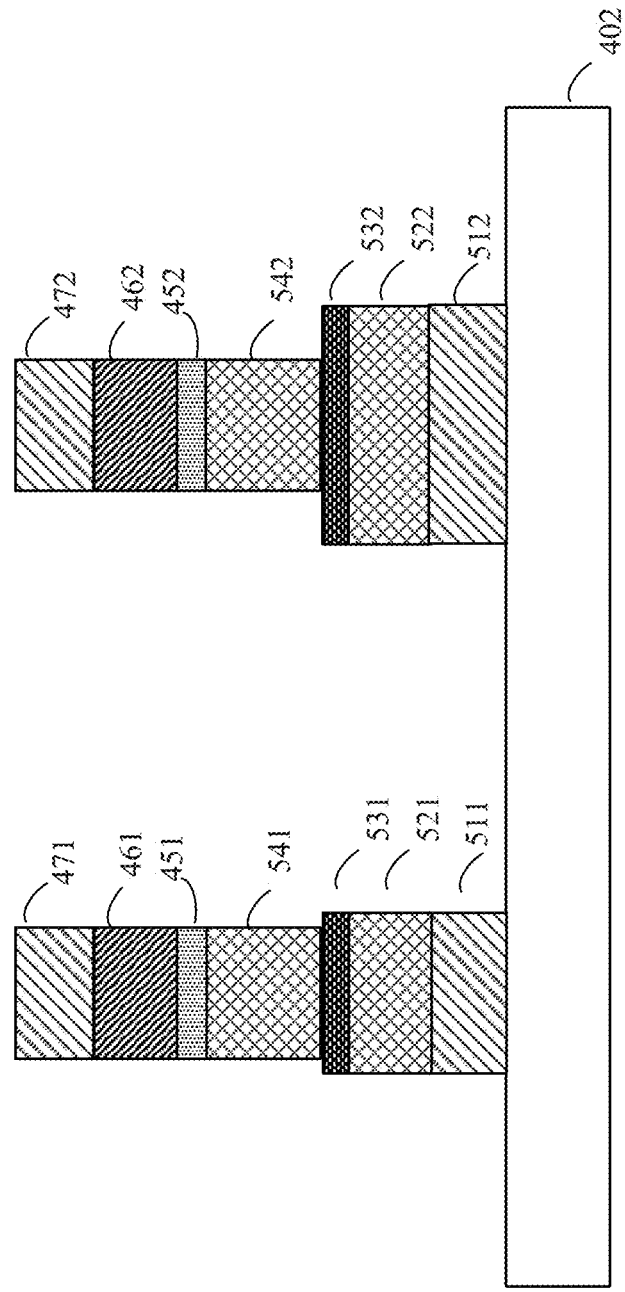

Following this first etching operation, a new mask can be employed to provide a new pattern used to etch the lower portion of the devices, where, as shown in FIG. 14, using a larger template for some of the devices can result in the desired magnetic moment differentiation between magnetic field sensing devices on the integrated circuit. For example, the patterning used to etch the layers 511, 521, and 531 in the device on the left has a smaller footprint, or area, then the patterning used to etch the layers 512, 522, and 532 for the device on the right. As such, if the thickness of the layers 541 and 542 is greater than the thickness of the layers 521 and 522, the smaller area for layer 521 results in a lesser magnetic moment for that layer with respect to layer 541, where, in contrast, the larger area for the layer 522 results in a greater magnetic moment for the layer 522 with respect to the layer 542.

Figure 15:
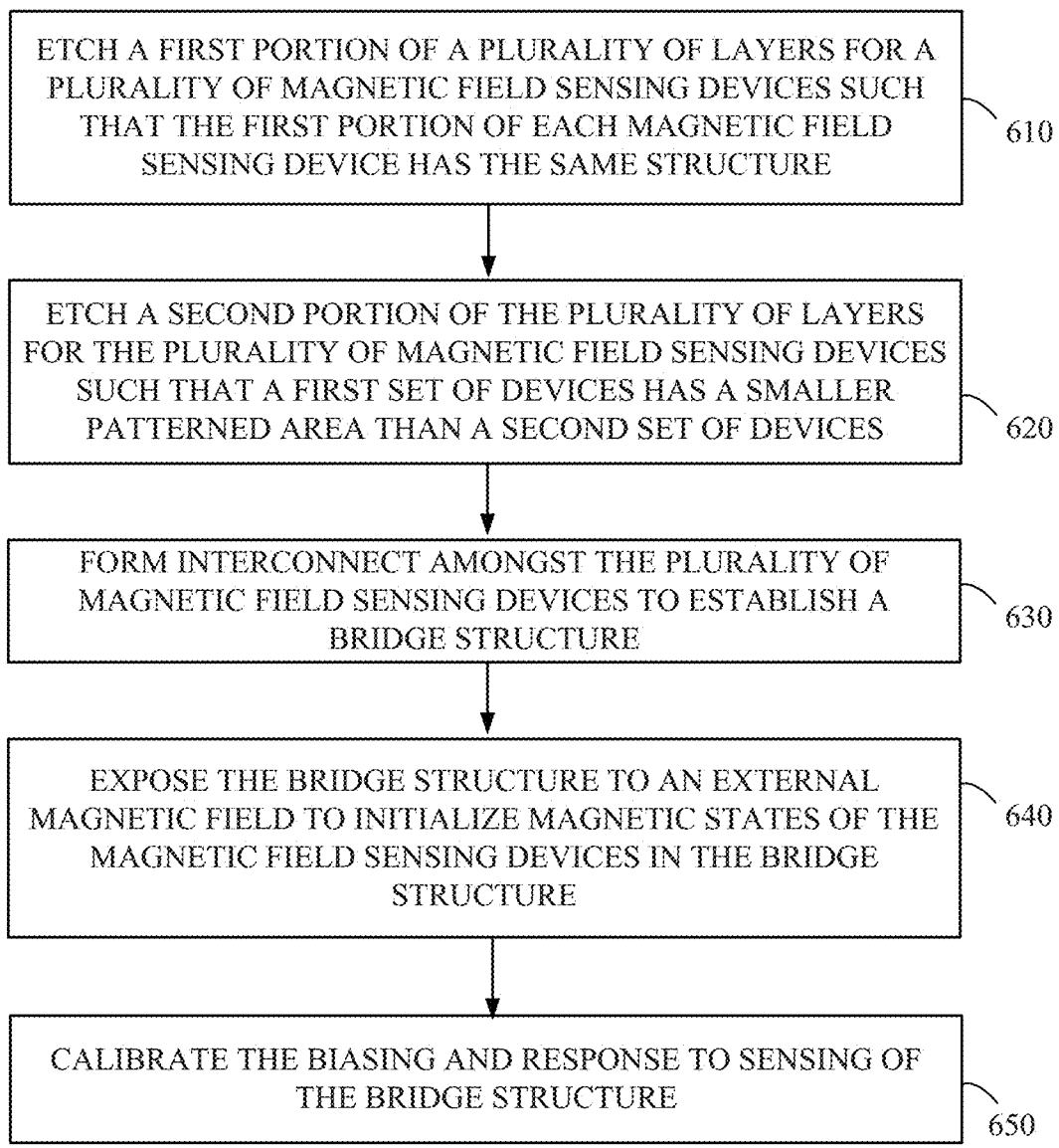
FIG. 15 is a flow chart illustrating a method for manufacturing a magnetic field sensor in accordance with an exemplary embodiment.

FIG. 15 is a flow chart that that illustrates an exemplary embodiment of a method for manufacturing a magnetic field sensor. The operations included in the flow chart may represent only a portion of the overall process used in manufacturing the magnetic field sensor. For illustrative purposes, the following description of the method in FIG. 15 may refer to elements mentioned above in connection with FIGS. 1-14. It should be appreciated that the methods may include any number of additional or alternative tasks, the tasks shown in FIG. 15 need not be performed in the illustrated order unless specified otherwise, and the method may be incorporated into a more comprehensive procedure or process having additional functionality not described in detail herein. Moreover, one or more of the tasks shown in FIG. 15 can be omitted from an embodiment as long as the intended overall functionality remains intact.

At 610 a first portion of the plurality of layers for a plurality of magnetic field sensing devices is etched. During the etching of the first portion at 610, the patterning used to form all of the magnetic field sensing devices is the same such that the first portion of each magnetic field sensing device of the plurality of magnetic field sensing devices has the same structure. In one embodiment, etching the first portion includes forming a free layer and a dielectric layer for each magnetic field sensing device of the plurality of magnetic field sensing devices. In some embodiments, the magnetic field sensing devices correspond to magnetic field sensing devices such as those discussed above with respect to FIGS. 1-8. The dielectric layer in the magnetic field sensing devices corresponds to a tunnel barrier that is part of a magnetic tunnel junction within the magnetic field sensing device. Etching the first portion can also include formation of the top electrode. In other embodiments, etching the first portion can include etching to form a free layer, a dielectric layer, and a first portion of the underlying SAF structure for the magnetic tunnel junction, which corresponds to an embodiment similar to the embodiment discussed above with respect to FIGS. 13 and 14.

At 620 a second portion of the plurality of layers for the plurality of magnetic field sensing devices is etched. During this etching of the second portion of the plurality of layers, different patterning is used for a first set of devices than is used for a second set of devices. The first set of devices is patterned to have a smaller area, or footprint, than the second set of devices. In some embodiments, etching the second portion includes etching the layers included in the SAF structure, which includes a first magnetic layer, a coupling layer, and a second magnetic layer. In other embodiments, the second etching may be limited to only a portion of the SAF structure. Such different patterning allows the SAF structures for the magnetic field sensing devices for the first set of devices to have a different magnetic moment imbalances than those of the SAF structures for the second set of devices. As discussed above with respect to FIGS. 10-12 as well as FIGS. 13 and 14, the combination of the patterned area for the set of devices with the width of the magnetic layers in the SAF structure allows the second etching operation to create the magnetic layers in the SAF structures such that they have different magnetic moments.

In some embodiments, as discussed above with respect to FIGS. 10-12, using an isotropic etch to etch the second portion of the layers allows the upper magnetic layer in the SAF structure to be etched in a manner that creates sloped sidewalls of the layers in the SAF structure, where the area associated with the SAF structure is determined based on the expected slope such that magnetic moment of the SAFs in the larger-area first set of devices is "top heavy," whereas the magnetic moment of the SAFs in the smaller-area second set of devices is "bottom heavy". In other words, the smaller first set of devices will have a moment imbalance favoring a smaller magnetic moment in the upper magnetic layer of the SAF compared to the lower layer, whereas the larger second set of devices will have a larger magnetic moment in the upper magnetic layer of the SAF compared to the lower layer.

In other embodiments, etching the second portion corresponds to etching the SAF structures, where the etch chemistry used is selective with respect to the coupling layer between the two magnetic layers within the SAF such that the coupling layer is etched at a slower rate than the first magnetic layer. Using such a selective etch chemistry allows for a greater reduction in material in the upper magnetic layer within the SAF, which can help in the development of different types of magnetic field sensing devices having different SAF structures on the integrated circuit.

At 630, interconnect is formed on the integrated circuit that facilitates the inter-coupling of the plurality of magnetic field sensing devices to establish one or more bridge structures on the integrated circuit. In some embodiments, the interconnect connecting the plurality of magnetic field sensing devices is formed before the etching operations at 610 and 620 are performed, whereas in other embodiments, the formation of the interconnect at 630 occurs either simultaneous with or after the various etching operations performed at 610 and 620. In some embodiments, the bridge structure corresponds to a bridge structure such as that depicted in FIG. 9 in which each path of the bridge includes one "top-heavy" device and one "bottom-heavy" device.

At 640, after the plurality of magnetic field sensing devices have been formed and interconnected in a bridge structure, the bridge structure is exposed to an external magnetic field to initialize the magnetic states of the magnetic field sensing devices in the bridge structure. For example, as discussed above, the integrated circuit that includes the bridge structure is exposed to a large perpendicular magnetic field that forces all of the magnetic layers within the magnetic field sensing devices to have a magnetic state that points in the same direction as the external magnetic field being applied to the bridge structure. For example, a perpendicular field pointing in the upward direction can be applied such that all of the magnetic layers within the magnetic field sensing devices are forced to point upward. Once the magnetic field being applied is removed, the coupling layer between the magnetic layers within the SAF structure forces one of the two magnetic layers within the SAF to flip to an opposite state (e.g. the downward pointing direction), where the magnetic layer that flips is the magnetic layer with the lesser magnetic moment. As such, magnetic field sensing devices in the first set, which are "top heavy" will have their upper magnetic layer in the SAF structure remain in the upward pointing direction. In contrast, magnetic field sensing devices and the second set, which are "bottom heavy" will have their upper magnetic layers flip to point in the downward pointing direction.

At 650 signals received from the bridge structure are calibrated in order to accurately interpret the signals in view of magnetic fields applied. Such calibration can include exposing the bridge structure to known magnetic fields and, based on the signals produced by the bridge structure in response to such known magnetic fields, generating the processing criteria used to accurately characterize magnetic fields to which the bridge structure is exposed in the future. Such calibration can also include adjusting the bias voltage applied across the bridge structure in order to ensure that the bridge provides for accurate sensing within an expected range. As noted above, changing the bias voltage applied across the bridge can impact the PMA for the free layers within individual magnetic field sensing devices based on voltage controlled anisotropy. Once calibrated and initialized the magnetic field sensor can be used to sense perpendicular magnetic fields accurately and without being impacted by in-plane magnetic fields.

As discussed herein, magnetic field sensors can be produced where different magnetic moment imbalances in SAFs of magnetic field sensing devices included in a bridge allow for accurate sensing of perpendicular magnetic fields in a differential manner that also cancels out interference from in-plane fields. Techniques for producing such magnetic field sensing devices on an integrated circuit are also disclosed, where the SAF structures for a first set of the magnetic field sensing devices have a first magnetic moment imbalance and the SAF structures for a second set of the magnetic field sensing devices has a second magnetic moment imbalance. As is also disclosed, the free layers within the magnetic field sensing devices can be adjusted in terms of their sensitivity range and level of sensitivity by manipulating the Hk for those free layers. Such manipulation can include the use of different materials within the free layers as well as at the borders of those free layers.

Although the described exemplary embodiments disclosed herein are directed to magnetic field sensing devices for sensing magnetic fields perpendicular to the film plane, the present disclosure is not necessarily limited to the exemplary embodiments. Thus, the particular embodiments disclosed above are illustrative only and should not be taken as limitations, as the embodiments may be modified and practiced in different but equivalent manners apparent to those skilled in the art having the benefit of the teachings herein. Accordingly, the foregoing description is not intended to limit the disclosure to the particular form set forth, but on the contrary, is intended to cover such alternatives, modifications and equivalents as may be included within the spirit and scope of the inventions as defined by the appended claims so that those skilled in the art should understand that they can make various changes, substitutions and alterations without departing from the spirit and scope of the inventions in their broadest form.

What is claimed is:

1. An integrated circuit, comprising:
   a first magnetic field sensing device formed on the integrated circuit, the first magnetic field sensing device including a first magnetic tunnel junction, wherein the first magnetic tunnel junction includes:
      a free layer having an in-plane steady state magnetization such that, absent any applied external magnetic field, magnetization of the free layer lies in-plane with a film plane corresponding to formation on the free layer;
      a reference layer having a steady state magnetization in a first direction perpendicular to the film plane absent any applied external magnetic field; and
      a dielectric layer between the free layer and the reference layer; and
   a second magnetic field sensing device formed on the integrated circuit, the second magnetic field sensing device including a second magnetic tunnel junction, wherein the second magnetic tunnel junction includes:
      a free layer having an in-plane steady state magnetization such that, absent any applied external magnetic field, magnetization of the free layer lies in-plane with the film plane;
      a reference layer having a steady state magnetization in a second direction perpendicular to the film plane absent any applied external magnetic field, wherein the first direction is opposite the second direction; and
      a dielectric layer between the free layer and the reference layer,
   wherein the reference layer in each of the first and second magnetic field sensing devices is an unpinned synthetic antiferromagnet (SAF).

2. The integrated circuit of claim 1, wherein the reference layer in each of the first and second magnetic field sensing devices includes a first magnetic layer and a second magnetic layer, wherein the first and second magnetic layers are separated by a coupling layer.

3. The integrated circuit of claim 2, wherein:
   the second magnetic layer of the first magnetic field sensing device has a greater magnetic moment than the first magnetic layer of the first magnetic field sensing device; and
   the second magnetic layer of the second magnetic field sensing device has a lesser magnetic moment than the first magnetic layer of the second magnetic field sensing device.

4. The integrated circuit of claim 3, wherein, for both of the first and second magnetic field sensing devices, the first magnetic layer has a first thickness and the second magnetic layer has a second thickness, wherein the first thickness is different than the second thickness.

5. The integrated circuit of claim 4, wherein a first footprint corresponding to area in the film-plane for the second magnetic layer in the first magnetic field sensing device is less than a first footprint corresponding to area in the film-plane for the second magnetic layer in the second magnetic field sensing device.

6. The integrated circuit of claim 2, wherein the first magnetic layer in each of the first and second magnetic field sensing devices includes at least one different material than the second magnetic layer in each of the first and second magnetic field sensing devices.

7. The integrated circuit of claim 1, further comprising:
   a third magnetic field sensing device formed on the integrated circuit, the third magnetoresistive sensing device having structural and magnetic characteristics matching the first magnetic field sensing device; and
   a fourth magnetic field sensing device formed on the integrated circuit, the fourth magnetoresistive sensing device having structural and magnetic characteristics matching the second magnetic field sensing device,
   wherein the first, second, third, and fourth magnetic field sensing devices are intercoupled to form a bridge that includes a first path between a first bias node and a second bias node and a second path between the first bias node and the second bias node, wherein:

the first path includes the first and second magnetic field sensing devices, wherein a first terminal of the first magnetic field sensing device is coupled to the first bias node, a second terminal of the first magnetic field sensing device is coupled to a first terminal of the second magnetic field sensing device, and a second terminal of the second magnetic field sensing device is coupled to the second bias node; and the second path includes the third and fourth magnetic field sensing devices, wherein a first terminal of the fourth magnetic field sensing device is coupled to the first bias node, a second terminal of the fourth magnetic field sensing device is coupled to a first terminal of the third magnetic field sensing device, and a second terminal of the third magnetic field sensing device is coupled to the second bias node.

8. The integrated circuit of claim 7, further comprising bias control circuitry coupled to the first bias node and the second bias node, wherein the bias control circuitry applies a bias voltage across the bridge.

9. The integrated circuit of claim 8, wherein the bias voltage is programmable.

10. The integrated circuit of claim 8, further comprising calibration circuitry coupled to the bias control circuitry, wherein the calibration circuitry determines the bias voltage applied by the bias control circuitry.

11. A magnetic field sensor, the magnetic field sensor comprising:
a plurality of magnetic field sensing devices, wherein the plurality of magnetic field sensing devices are intercoupled to form a bridge, wherein the plurality of magnetic field sensing devices includes:
first magnetic field sensing devices having a free layer, a reference layer, and a dielectric layer between the free layer and the reference layer, wherein a steady state magnetization of the free layer is in-plane with a film plane and a steady state magnetization of the reference layer is perpendicular to the film plane and in a first direction; and
second magnetic field sensing devices having a free layer, a reference layer, and a dielectric layer between the free layer and the reference layer, wherein a steady state magnetization of the free layer is in-plane with the film plane and a steady state magnetization of the reference layer is perpendicular to the film plane and in a second direction opposite to the first direction,
wherein the reference layer in each of the first and second magnetic field sensing devices includes a first magnetic layer and a second magnetic layer, wherein the first and second magnetic layers are separated by a coupling layer,
wherein the first magnetic layer in each of the first and second magnetic field sensing devices includes at least one different material than the second magnetic layer in each of the first and second magnetic field sensing devices, and
wherein the bridge includes a first path between a first bias node and a second bias node and a second path between the first bias node and the second bias node, wherein each of the first and second paths includes at least one of the first magnetic field sensing devices and at least one of the second magnetic field sensing devices; and
bias control circuitry coupled to the bridge, wherein the bias control circuitry applies a bias voltage across the first and second paths of the bridge.

12. The magnetic field sensor of claim 11, wherein the reference layer of the first and second magnetic field sensing devices includes a synthetic antiferromagnet that includes the first and second magnetic layers separated by the coupling layer, wherein the first and second magnetic field sensing devices are formed using shared processing steps.

13. The magnetic field sensor of claim 12, wherein:
the second magnetic layer of the first magnetic field sensing devices has a greater magnetic moment than the first magnetic layer of the first magnetic field sensing devices; and
the second magnetic layer of the second magnetic field sensing devices has a lesser magnetic moment than the first magnetic layer of the second magnetic field sensing devices.

14. The magnetic field sensor of claim 13, wherein the free layer and dielectric layer portions of the first and second magnetic field sensing devices have the same structural and magnetic characteristics.

15. The magnetic field sensor of claim 11, wherein patterning of the free layers for the first and second magnetic field sensing devices is circular.

16. An integrated circuit, comprising:
a first magnetic field sensing device formed on the integrated circuit, the first magnetic field sensing device including a first magnetic tunnel junction, wherein the first magnetic tunnel junction includes:
a free layer having an in-plane steady state magnetization such that, absent any applied external magnetic field, magnetization of the free layer lies in-plane with a film plane corresponding to formation on the free layer;
a reference layer having a steady state magnetization in a first direction perpendicular to the film plane absent any applied external magnetic field; and
a dielectric layer between the free layer and the reference layer; and
a second magnetic field sensing device formed on the integrated circuit, the second magnetic field sensing device including a second magnetic tunnel junction, wherein the second magnetic tunnel junction includes:
a free layer having an in-plane steady state magnetization such that, absent any applied external magnetic field, magnetization of the free layer lies in-plane with the film plane;
a reference layer having a steady state magnetization in a second direction perpendicular to the film plane and opposite to the first direction absent any applied external magnetic field; and
a dielectric layer between the free layer and the reference layer,
wherein the reference layer in each of the first and second magnetic field sensing devices includes a first magnetic layer and a second magnetic layer, wherein the first and second magnetic layers are separated by a coupling layer, and
wherein a first footprint corresponding to area in the film-plane for the second magnetic layer in the first magnetic field sensing device is less than a first footprint corresponding to area in the film-plane for the second magnetic layer in the second magnetic field sensing device.

17. The integrated circuit of claim 16, wherein the reference layer in each of the first and second magnetic field sensing devices is an unpinned synthetic antiferromagnet (SAF).

18. The integrated circuit of claim 16,
wherein the second magnetic layer of the first magnetic field sensing device has a greater magnetic moment than the first magnetic layer of the first magnetic field sensing device, and
wherein the second magnetic layer of the second magnetic field sensing device has a lesser magnetic moment than the first magnetic layer of the second magnetic field sensing device.

19. The integrated circuit of claim 16, further comprising:
a third magnetic field sensing device formed on the integrated circuit, the third magnetoresistive sensing device having structural and magnetic characteristics matching the first magnetic field sensing device; and
a fourth magnetic field sensing device formed on the integrated circuit, the fourth magnetoresistive sensing device having structural and magnetic characteristics matching the second magnetic field sensing device,
wherein the first, second, third, and fourth magnetic field sensing devices are intercoupled to form a bridge that includes a first path between a first bias node and a second bias node and a second path between the first bias node and the second bias node, wherein:

the first path includes the first and second magnetic field sensing devices, wherein a first terminal of the first magnetic field sensing device is coupled to the first bias node, a second terminal of the first magnetic field sensing device is coupled to a first terminal of the second magnetic field sensing device, and a second terminal of the second magnetic field sensing device is coupled to the second bias node; and the second path includes the third and fourth magnetic field sensing devices, wherein a first terminal of the fourth magnetic field sensing device is coupled to the first bias node, a second terminal of the fourth magnetic field sensing device is coupled to a first terminal of the third magnetic field sensing device, and a second terminal of the third magnetic field sensing device is coupled to the second bias node.

20. The magnetic field sensor of claim 11, wherein the reference layer in each of the first and second magnetic field sensing devices is an unpinned synthetic antiferromagnet (SAF).

\* \* \* \* \*